US010154580B2

(12) United States Patent
Crotty, Jr. et al.

(10) Patent No.: US 10,154,580 B2
(45) Date of Patent: Dec. 11, 2018

(54) BOARD LEVEL SHIELDS WITH ADJUSTABLE COVERS

(71) Applicant: Laird Technologies, Inc., Earth City, MO (US)

(72) Inventors: Paul W. Crotty, Jr., East Stroudsburg, PA (US); Mark Fucci, Easton, PA (US); Kenneth M. Robinson, Effort, PA (US)

(73) Assignee: LAIRD TECHNOLOGIES, INC., Earth City, MO (US)

( * ) Notice: Subject to any disclaimer, the term of this patent is extended or adjusted under 35 U.S.C. 154(b) by 0 days.

(21) Appl. No.: 15/691,021

(22) Filed: Aug. 30, 2017

(65) Prior Publication Data
US 2018/0007783 A1  Jan. 4, 2018

Related U.S. Application Data

(63) Continuation of application No. PCT/US2016/031446, filed on May 9, 2016.

(60) Provisional application No. 62/159,910, filed on May 11, 2015.

(51) Int. Cl.
H05K 1/02 (2006.01)
H05K 9/00 (2006.01)

(52) U.S. Cl.
CPC ......... H05K 1/0216 (2013.01); H05K 1/0203 (2013.01); H05K 9/0032 (2013.01)

(58) Field of Classification Search
CPC .. H05K 9/0024; H05K 9/0032; H05K 1/0216; H05K 1/0203
See application file for complete search history.

(56) References Cited

U.S. PATENT DOCUMENTS

| | | | |
|---|---|---|---|
| 6,744,640 B2 | 6/2004 | Reis et al. | |
| 7,371,618 B2 | 5/2008 | Yoon | |
| 7,463,496 B2 | 12/2008 | Robinson et al. | |
| 7,623,360 B2 | 11/2009 | English et al. | |
| 7,830,672 B1 | 11/2010 | Kitchen | |
| 8,270,162 B2 | 9/2012 | Peng et al. | |
| 8,477,499 B2 | 7/2013 | Hill et al. | |
| 8,953,325 B2 | 2/2015 | Yu et al. | |
| 9,924,616 B2 * | 3/2018 | Song | H05K 9/0032 |
| 2007/0210082 A1 | 9/2007 | English et al. | |
| 2009/0207579 A1 | 8/2009 | Boetto et al. | |
| 2009/0211802 A1 | 8/2009 | Poulsen | |
| 2013/0250540 A1 | 9/2013 | Hou | |
| 2015/0264842 A1 | 9/2015 | Song et al. | |
| 2015/0282392 A1 | 10/2015 | Liu et al. | |

(Continued)

OTHER PUBLICATIONS

Punzenberger S et al: "Variable Height Two-Piece Shield", Motorola Technical Developments, Motorola Inc. Schaumburg, Illinois, US, vol. 33, Dec. 1, 1997 (p. 10/11).

(Continued)

Primary Examiner — Robert J Hoffberg
Assistant Examiner — Hung Dang
(74) Attorney, Agent, or Firm — Harness, Dickey & Pierce, P.L.C.; Anthony G. Fussner

(57) ABSTRACT

According to various aspects, exemplary embodiments are disclosed of board level shields. In an exemplary embodiment, a board level shield generally includes a cover (or lid) and a fence (or frame or base). The cover is attachable to the fence in a plurality of different positions.

19 Claims, 11 Drawing Sheets

(56) References Cited

U.S. PATENT DOCUMENTS

2015/0282393 A1 10/2015 Kurz et al.
2015/0316966 A1 11/2015 Chen et al.

OTHER PUBLICATIONS

European Search Report dated May 4, 2018 for European application No. 16793309.2 filed Nov. 21, 2017 which claims priority to the same parent application as the instant application, 5 pages.
International Search Report and Written Opinion for PCT application No. PCT/US2016/031446 filed May 9, 2016 (published as WO 2016/182996 on Nov. 17, 2016) which is the parent application to the instant application, dated Aug. 18, 2016, 15 pages.

* cited by examiner

BOARD LEVEL SHIELDS WITH ADJUSTABLE COVERS

CROSS-REFERENCE TO RELATED APPLICATIONS

This application is a continuation of PCT International Application No. PCT/US2016/031446 filed May 9, 2016 (published as WO 2016/182996 on Nov. 17, 2016) which claims priority to and the benefit of U.S. Provisional Patent Application No. 62/159,910 filed May 11, 2015. The entire disclosures of the above applications are incorporated herein by reference.

FIELD

The present disclosure generally relates to board level shields with adjustable covers.

BACKGROUND

This section provides background information related to the present disclosure which is not necessarily prior art.

A common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

Figure 1:
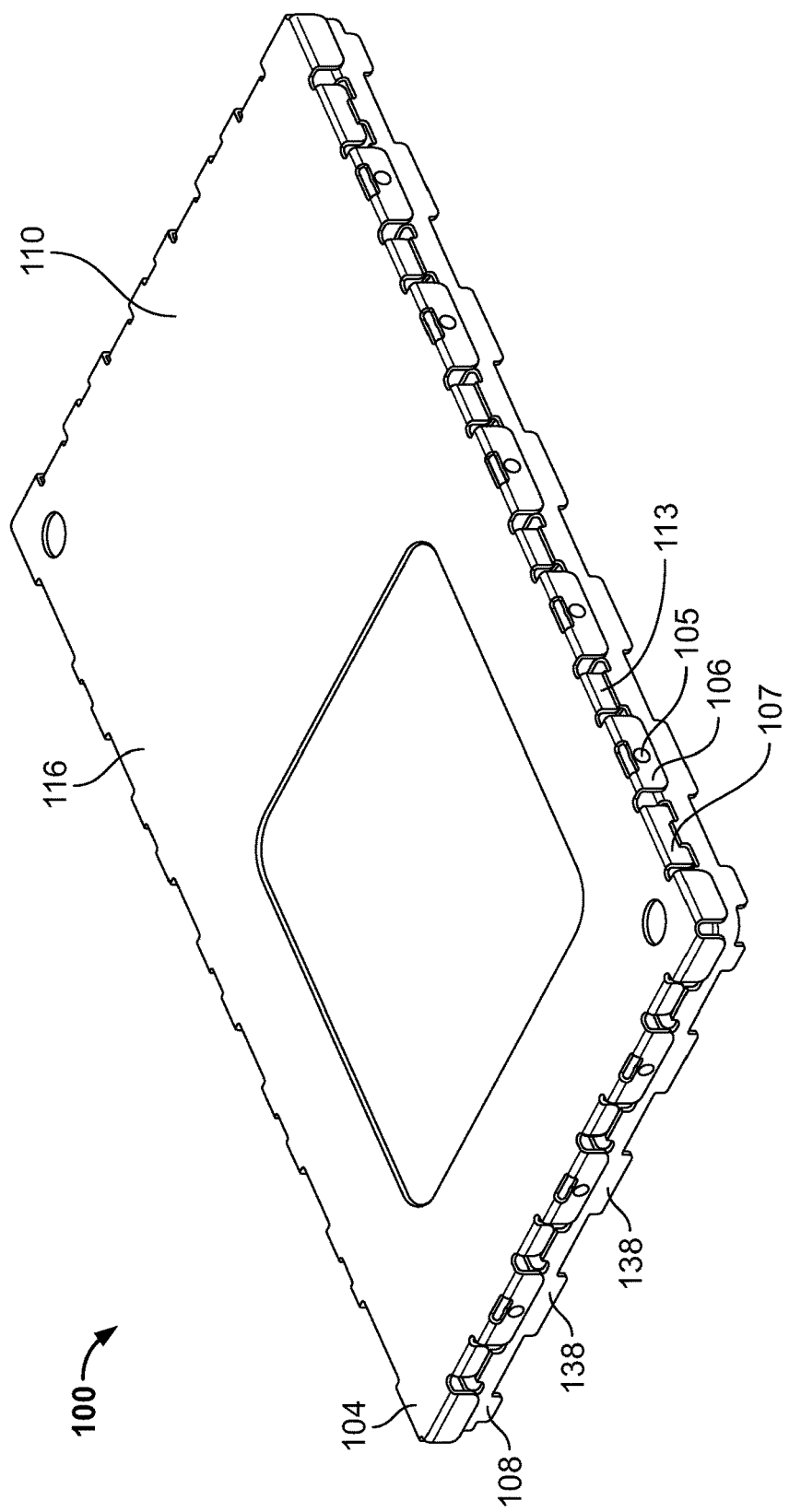
FIG. 1 is a perspective view of an exemplary embodiment of a board level shield (BLS) including a cover that is attachable to a fence at different heights or positions such that the position or height of the cover relative to the fence is selectively adjustable or variable.
Figure 3:
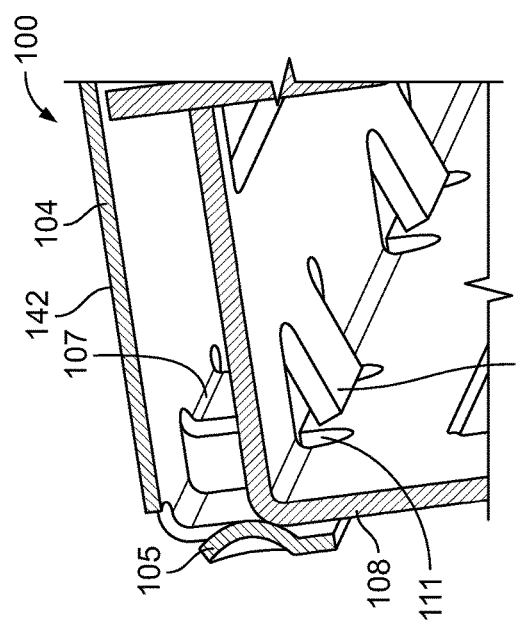
FIG. 3 is a partial perspective view of the board level shield shown in FIG. 1, where the cover has been initially placed on the fence and the cover is being held up in an initial, unlatched position by the cover's dimples and downwardly extending tabs or locking features contacting the fence.
Figure 5:
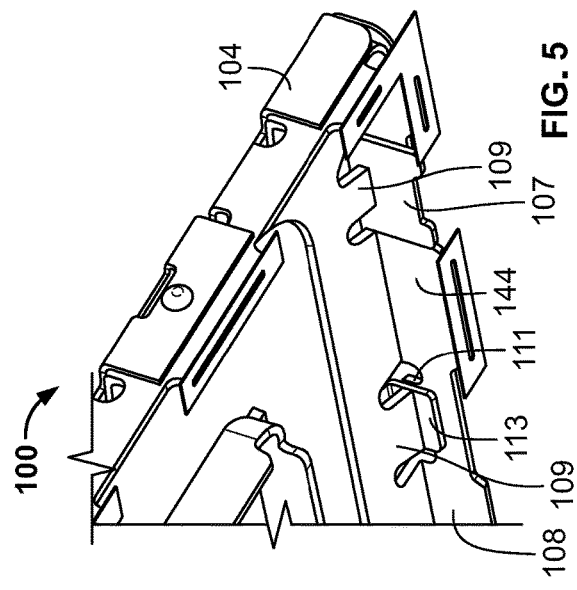
Figure 4:
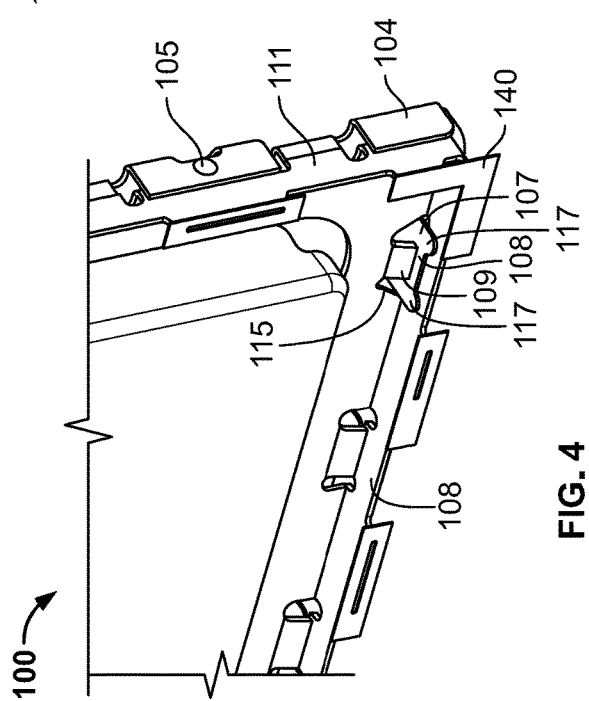
Figure 6:
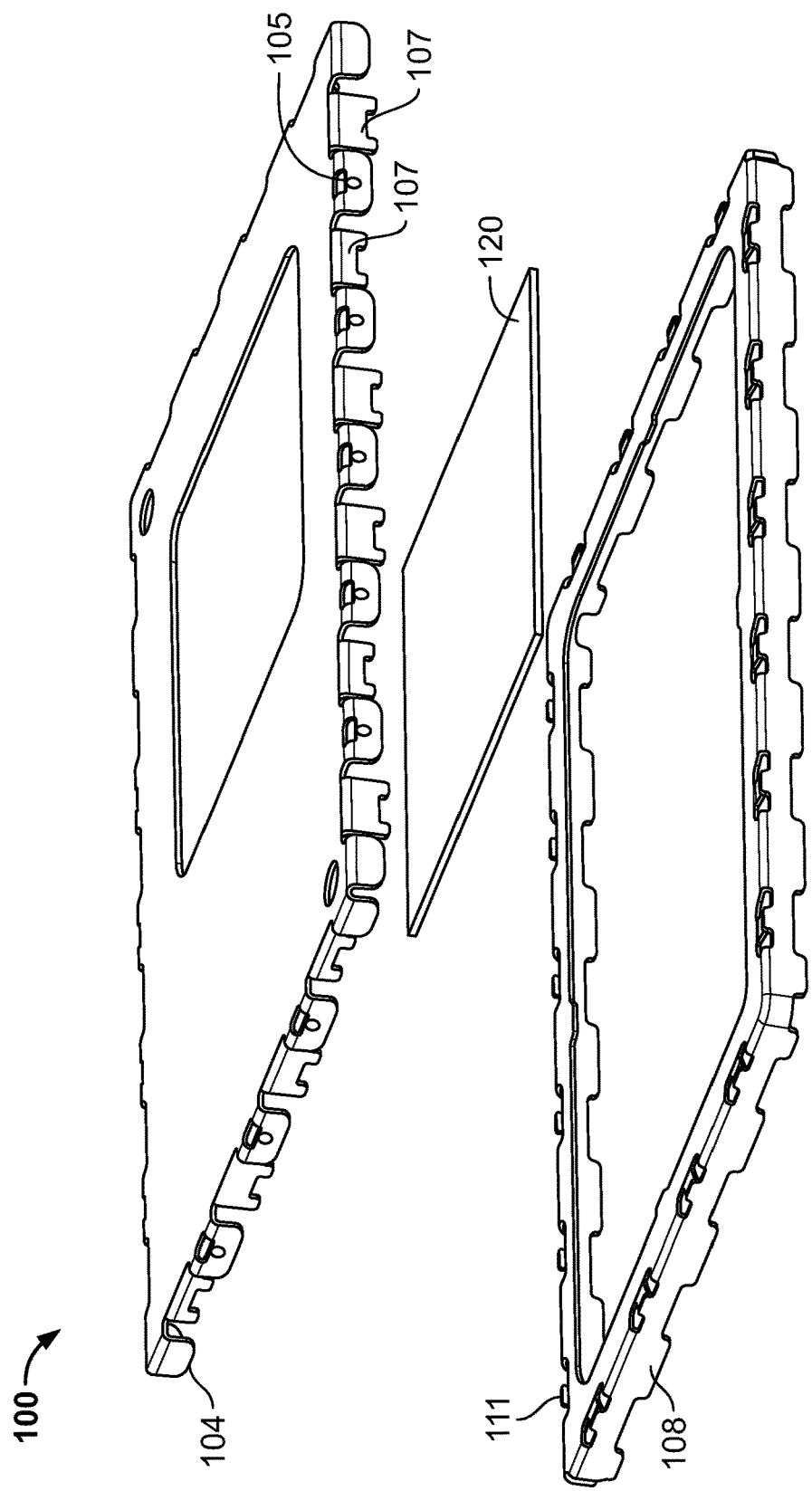
Figure 7:
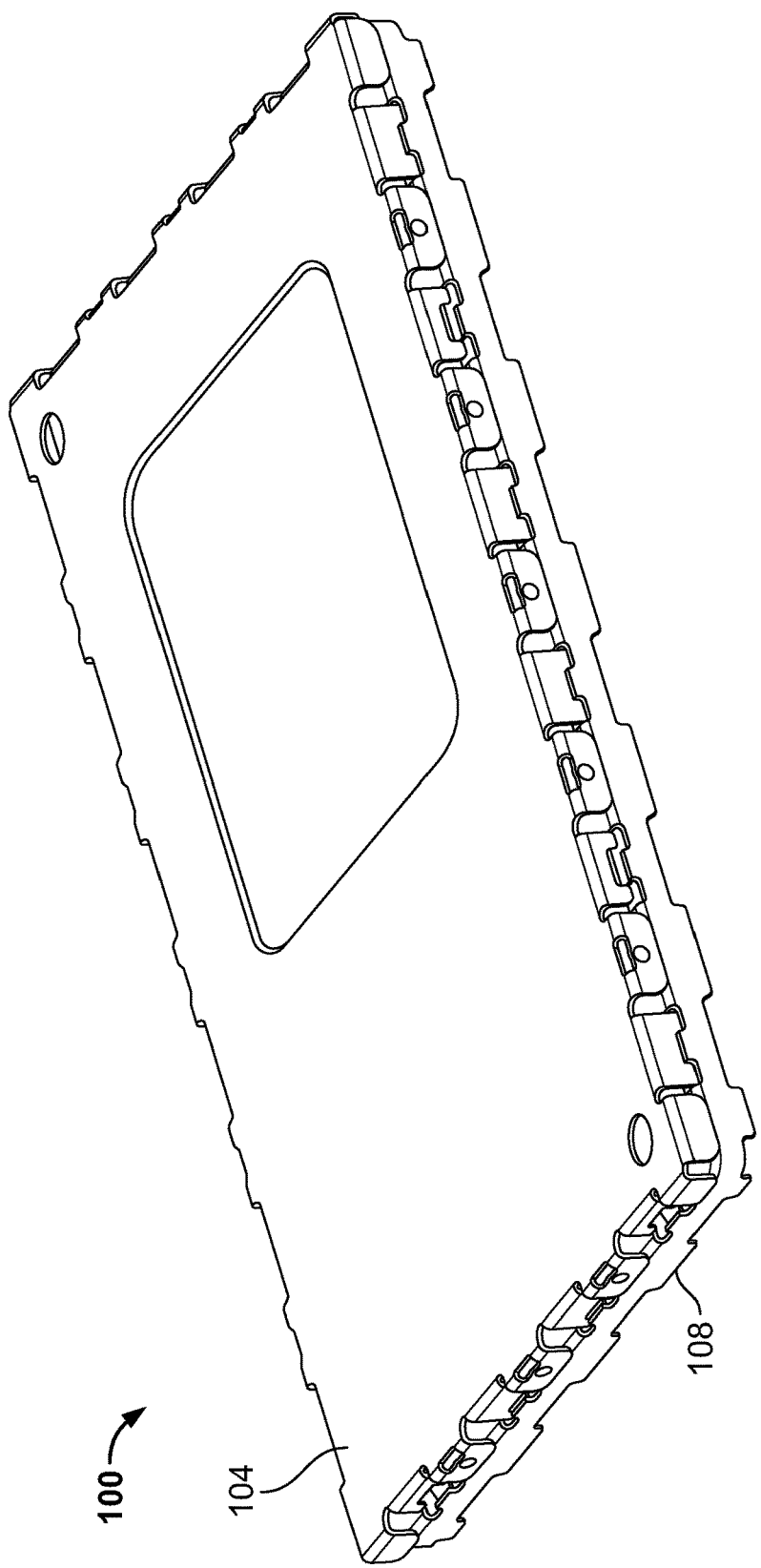
Figure 8:
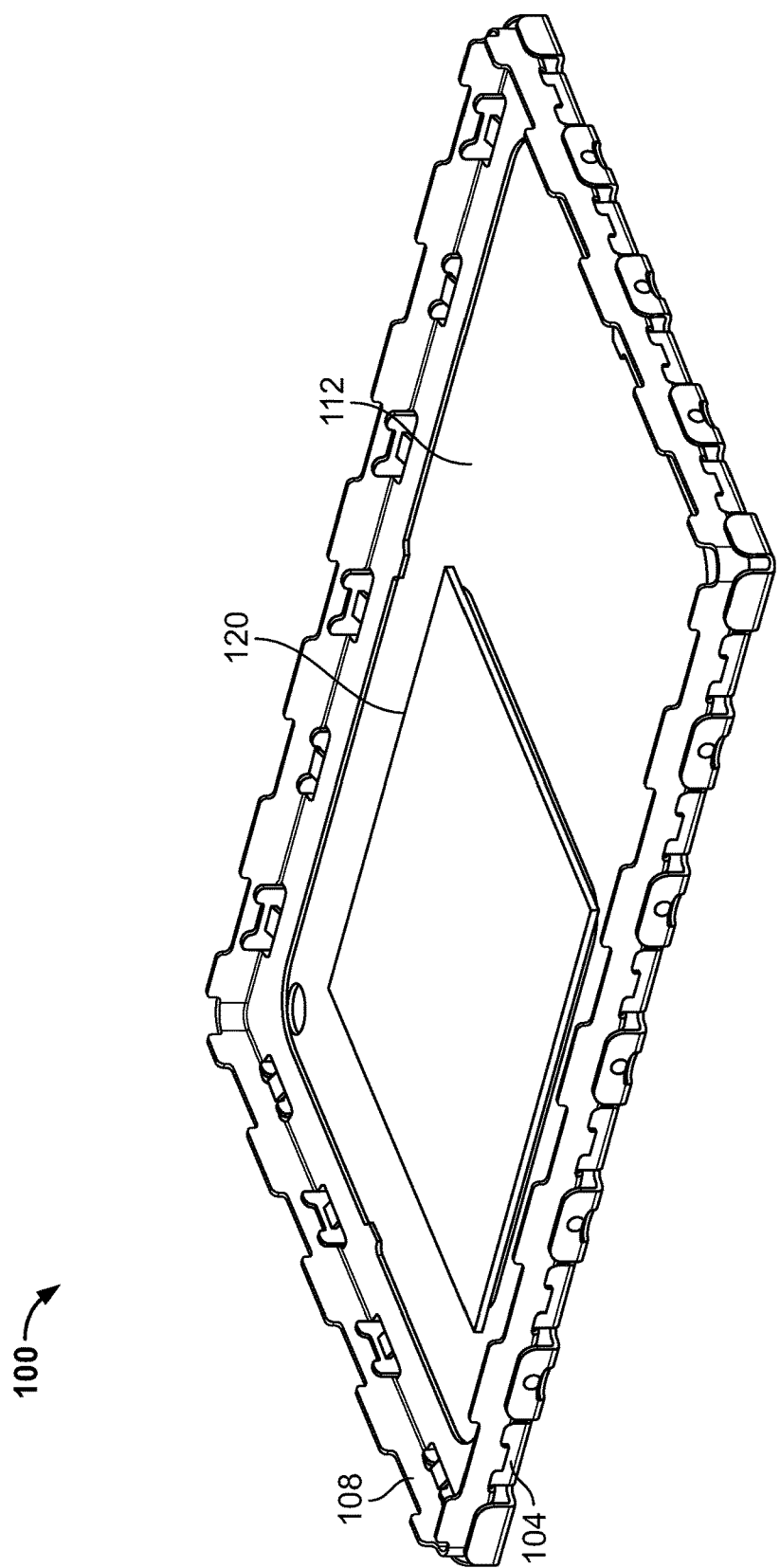
Figure 9:
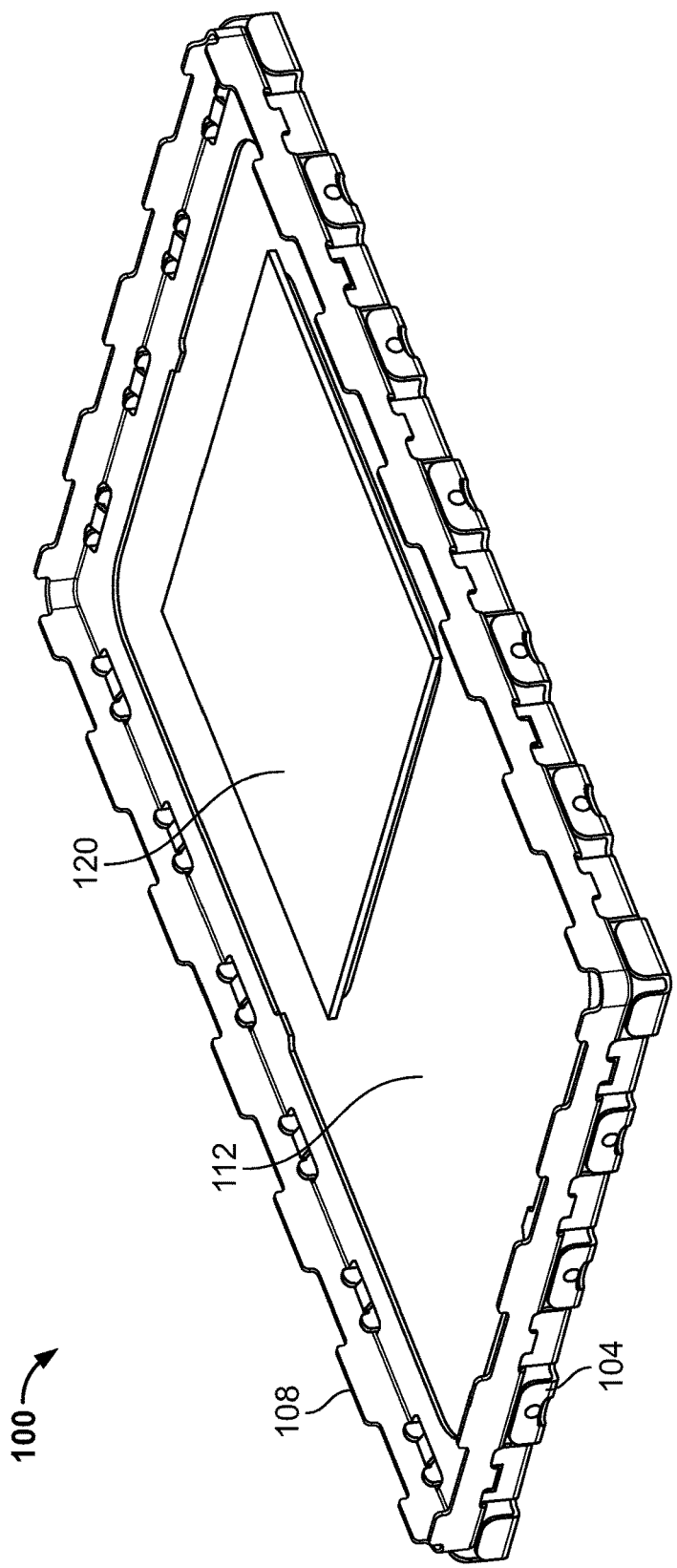
Figure 10:
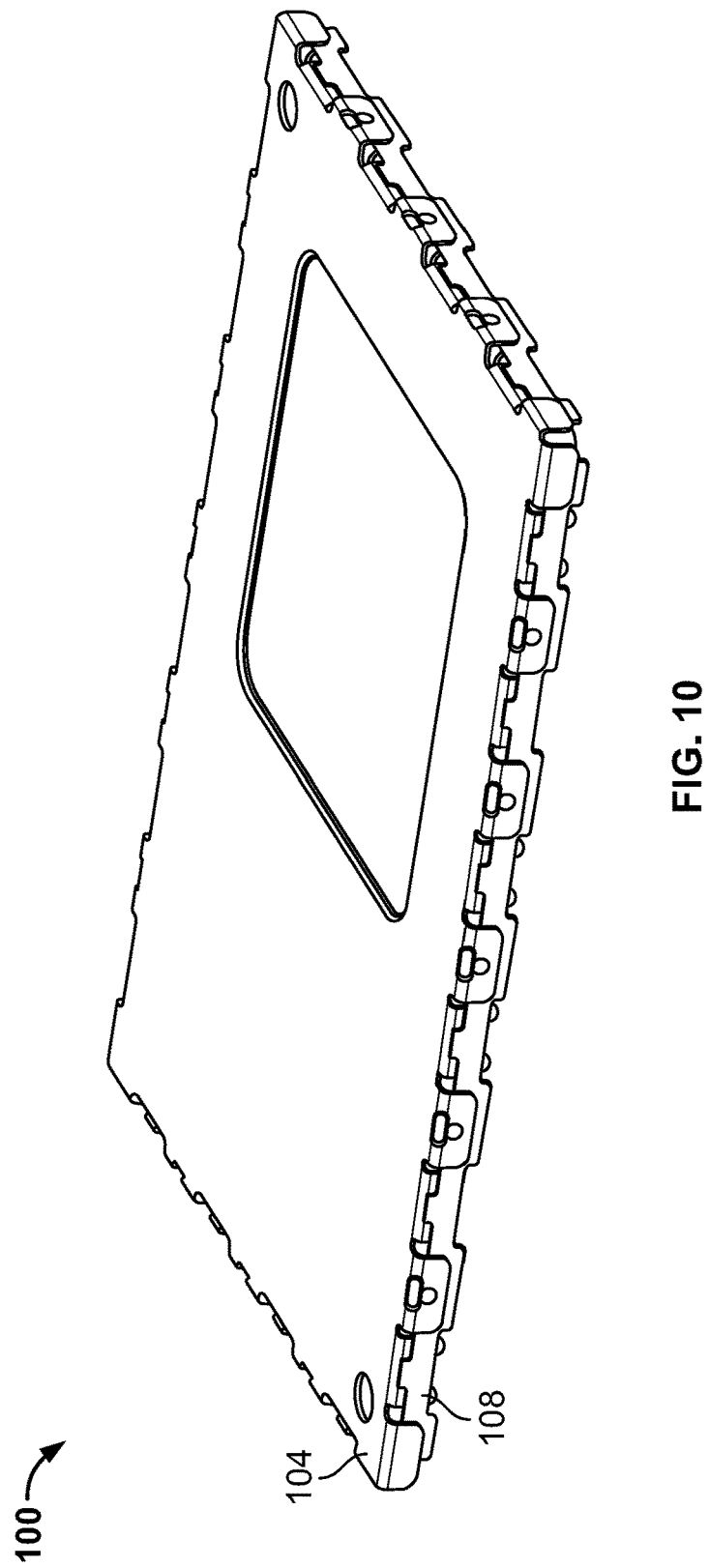
Figure 11:
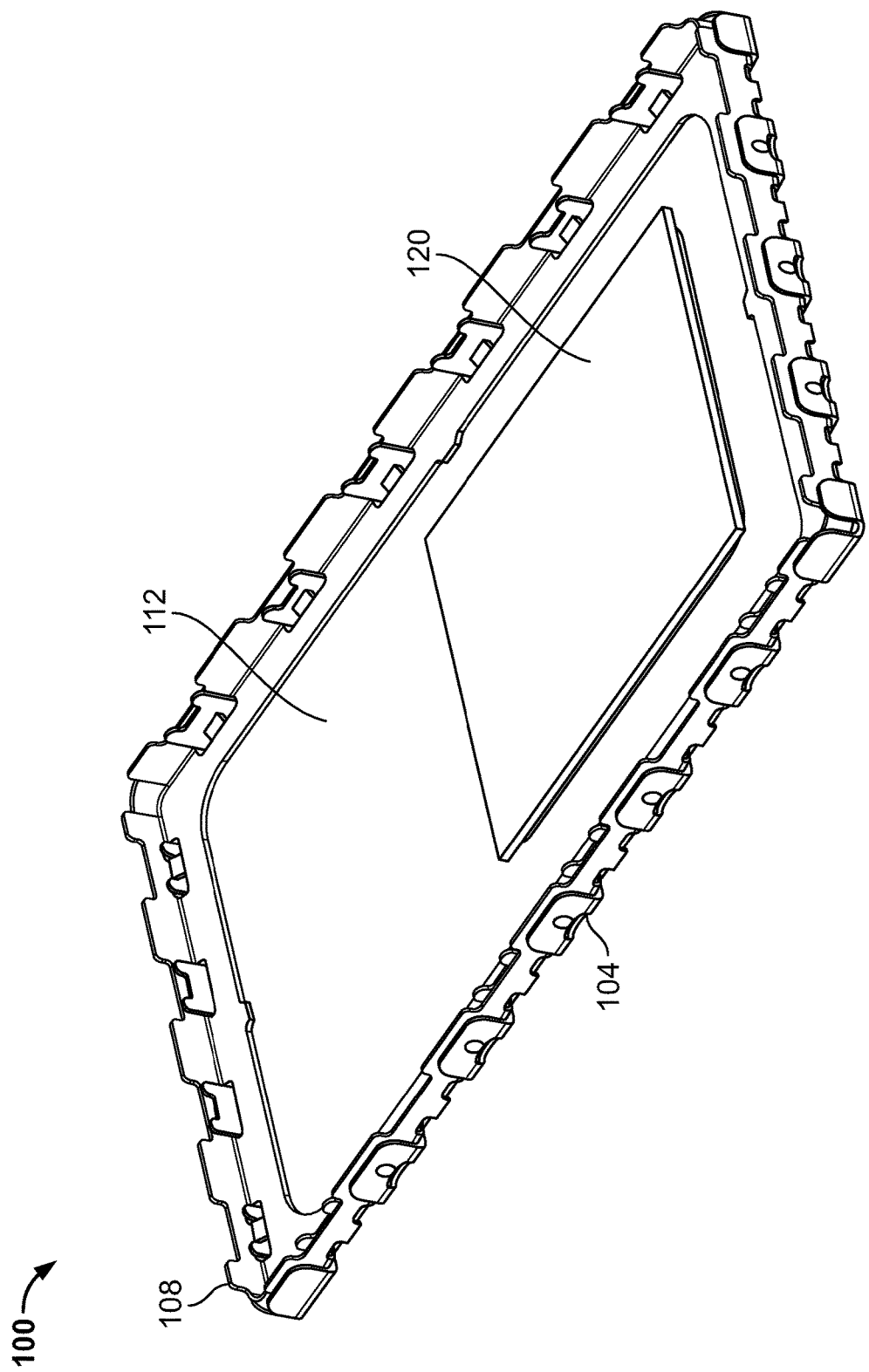
Figure 12:
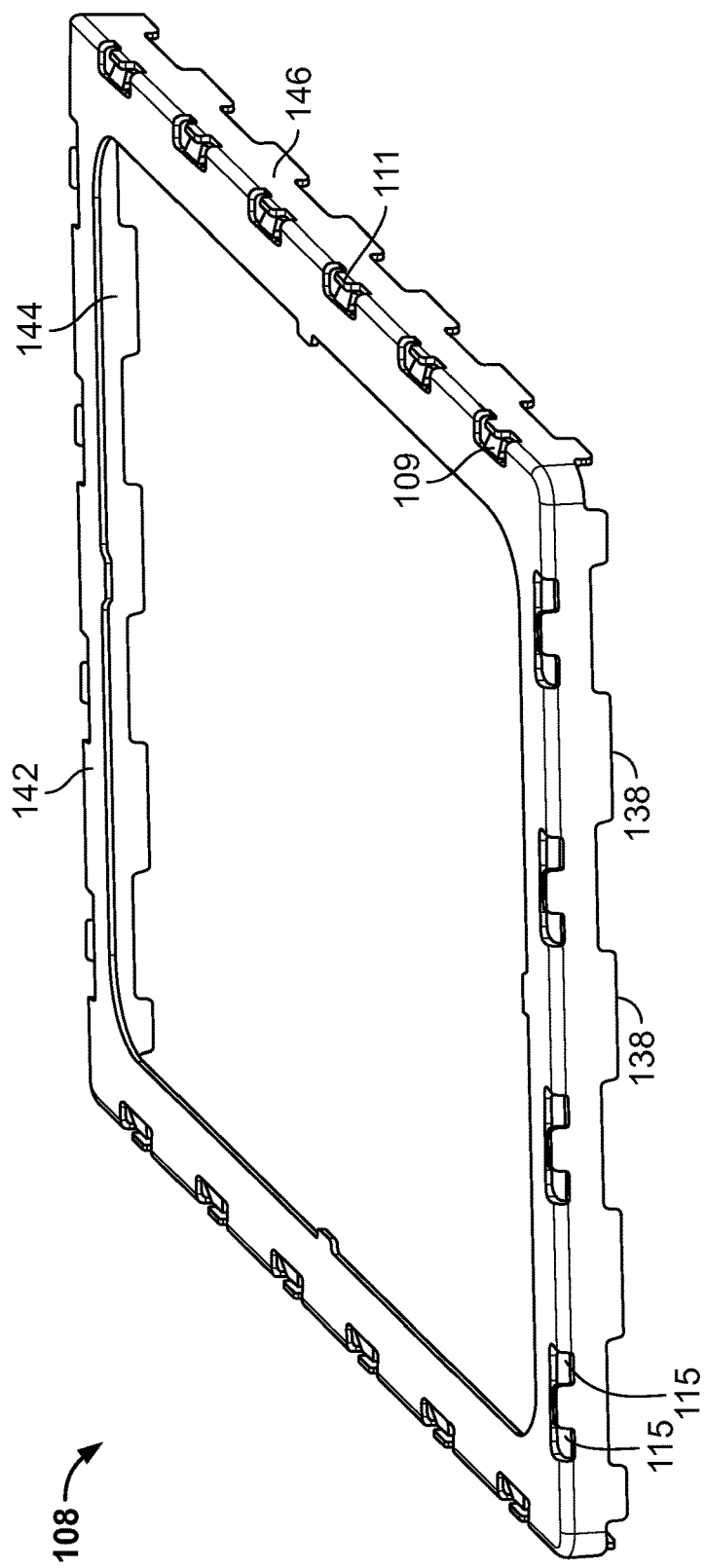
Figure 13:
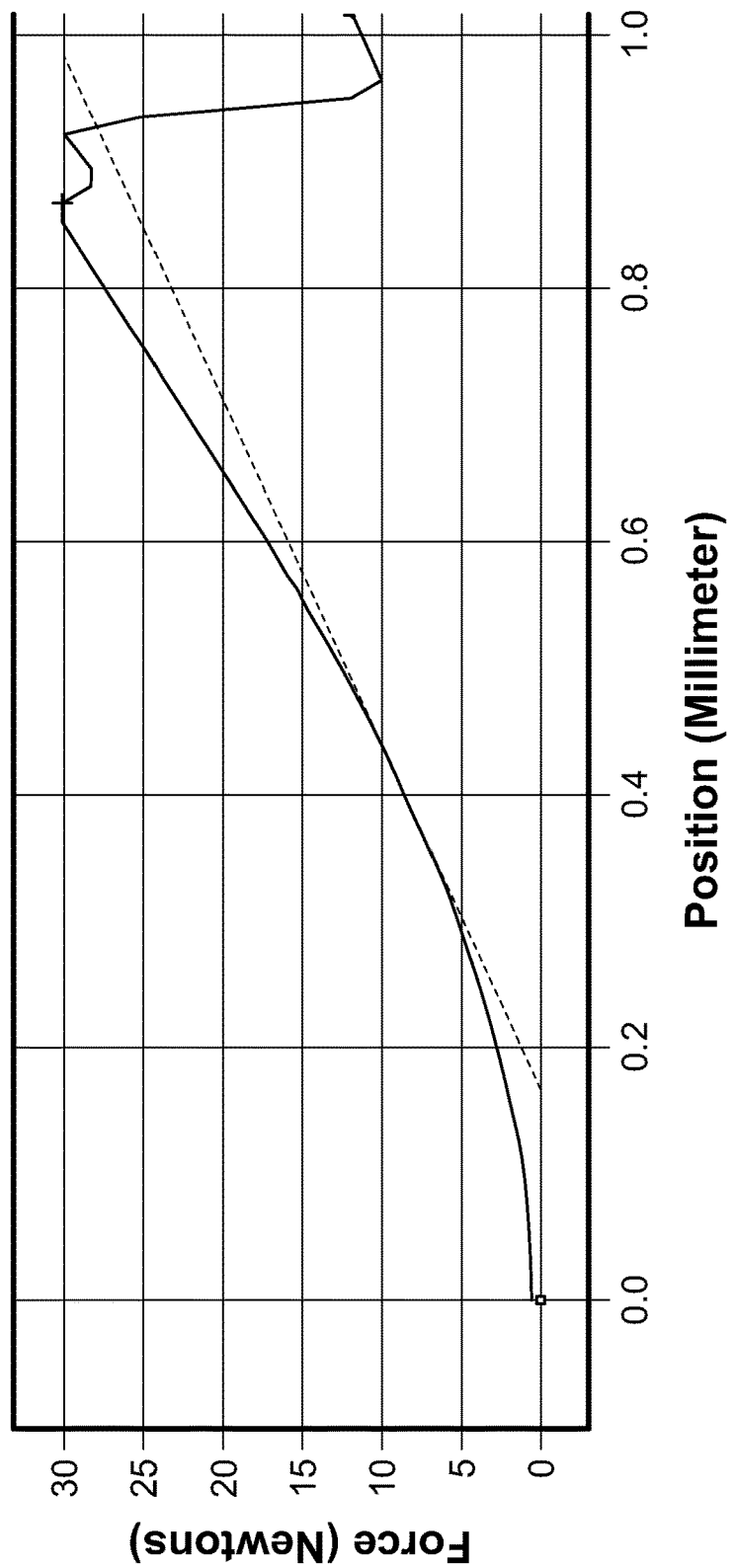

FIG. 4 is a partial perspective view of the board level shield shown in FIG. 3 after the cover has been pushed downward onto the fence into a first latched position in which the cover is held down on or retained to the fence in a raised or up position relative to the fence by the interaction of (e.g., contact between, etc.) the fence's outwardly extending tabs or portions and the cover's downwardly extending tabs or locking features and by the interaction (e.g., contact between, etc.) the cover's dimples and corresponding sidewall portions of the fence;

FIG. 5 is a partial perspective view of the board level shield shown in FIG. 4 after the cover has been pushed farther downwardly onto the fence into another latched position in which the cover is in a lowered or down position relative to the fence;

FIG. 6 is an exploded perspective view of the board level shield shown in FIG. 1, and illustrating the cover, the fence, and the thermal interface material;

FIG. 7 is a perspective view of the board level shield shown in FIG. 6 with the cover shown on the fence in a raised or up position;

FIGS. 8 and 9 are perspective views showing the interior of the board level shield shown in FIG. 6 with the cover in the raised or up position relative to the fence;

FIG. 10 is a perspective view of the board level shield shown in FIG. 7 after the cover has been pushed downwardly onto the fence into a lowered or down position relative to the fence;

FIG. 11 is a perspective view showing the interior of the board level shield shown in FIG. 10 with the cover in the lowered or down position relative to the fence;

FIG. 12 is a perspective view of the fence of the board level shield shown in FIG. 6; and FIG. 13 is a line graph of force in Newtons versus position in millimeters showing the amount of force to push out the cover (one locking feature completely released) according to an exemplary embodiment.

DETAILED DESCRIPTION

Example embodiments will now be described more fully with reference to the accompanying drawings.

The inventors hereof have recognized the following about conventional board level shields. A conventional two piece board level shield (BLS) is generally made from sheet metal materials that have good thermal conductivity. It is desirable to add thermal interface material to the inside of the BLS cover to get the thermal energy out of the electronic components under the BLS. Thermal interface materials generally require some compressive force to work efficiently. But conventional BLS locking features like dimples and holes do not generate an optimal holding force. Half dimples and holes have a more positive locking capability, but are not ideal. Dimples and half dimples require the BLS to be tall enough to add locking dimples that are deep enough to engage the side walls of the BLS fence or base. Additionally, there is a tolerance stack up issue for half dimples. The height of the component(s), height of the fence, the placement of the locking dimples, and the placement of the locking holes all add up to make it difficult to get the needed compression force for the thermal interface material.

After recognizing the above, the inventors hereof developed the disclosed exemplary embodiments of board level shields. In exemplary embodiments, a board level shield includes a cover (or lid) and a fence (or frame or base). The cover is attachable to the fence at different positions or heights such that the position or height of the cover relative to the fence is selectively adjustable or variable. For example, the cover may be attached (e.g., latched, locked, etc.) to the fence in a first position such that a spaced distance separates at least one thermal interface material along the cover's inner surface from one or more components disposed under the board level shield. The cover may then be moved downwardly into another position (e.g., final, fully down, or operational position, etc.) in which the spaced distance is substantially eliminated and the thermal interface material is compressed against a top of the one or more components under the shield. Accordingly, this exemplary embodiment may thus provide an EMI shielding and thermal management assembly having multi-position latching that allows the cover to be attached to the fence in multiple different positions or heights.

In exemplary embodiments, the latching mechanism is built into the top of the fence and the cover interface is flat (e.g., featureless without any upwardly protruding features, etc.), which may allow for low fence heights. For the example, the latching mechanisms do not include any features that protrude upwardly above or beyond the top surface of the fence or the cover in some exemplary embodiments. The latching features disclosed herein can generate holding forces that are higher than that generated by standard dimples and that are comparable to the half dimple locking scheme. Because there is no target locking hole to engage, the cover may be pushed down to different heights (e.g., continuously adjustable, etc.) onto the fence and be held relatively tightly in place. Exemplary embodiments may thus allow for the elimination of the tolerance stack up issue associated with half dimple locking schemes.

Exemplary embodiments may also allow the cover having a thermal interface material thereon (e.g., thermal pad or other thermal interface material along the cover's inner surface, etc.) to be assembled or attached (e.g., pushed down and latched, etc.) onto the fence in a first or raised position (e.g., in a first stage prior to solder reflow, etc.). This first or raised position may allow or accommodate for the needed heat transfer to the components under the shield to insure the components are properly soldered to the printed circuit board (PCB). Shortly after the solder has solidified, the cover may then be pushed downward relative to the fence, e.g., a second time, into a second or lower position (e.g., a second stage after solder reflow, etc.). The downward movement of the cover relative to the fence may compress the thermal interface material along the cover's inner surface against one or more components under the shield. In this second or lower position, there is good compressive contact between the thermal interface material, the components, and the cover (e.g., sheet metal cover, etc.). There is also improved contact force reliability that provides a better performing BLS/thermal interface material assembly.

With reference to the figures, FIG. 1 illustrates an exemplary embodiment of a board level shield (BLS) 100 according to aspects of the present disclosure. The shield 100 includes a cover or lid 104 (broadly, an upper or top surface) and a fence, frame, or base 108. The cover 104 is selectively attachable to the fence 108 in multiple positions or at different heights such that the position or height of the cover 104 relative to the fence 108 is selectively adjustable or variable.

For example, as shown in FIG. 3, the cover 104 may be initially placed on the fence 108 such that the cover 104 is held up in an initial unlatched position by the cover's dimples 105 (broadly, inwardly protruding portions or detents) and downwardly extending locking tabs or features 107 (broadly, portions). The cover's dimples 105 contact an upper portion of the fence 108. The cover's locking tabs 107 contact the fence's outwardly (e.g., generally horizontally, curved, etc.) extending locking tabs or features 109 (broadly, portions). In the initial unlatched position, the cover's inner surface 112 is spaced apart from a top surface 142 (e.g., perimeter flange shown in FIG. 12, etc.) of the fence 108.

From the initial unlatched position shown in FIG. 3, the cover 104 may be pushed downward relative to the fence 108 into a first latched position shown in FIG. 4. As the cover 104 is moved downward, the dimples 105 may operate as camming surfaces to urge the cover's portions 106 (e.g., downwardly extending resilient tabs, etc.) that include the dimples 105 outward away from the fence 108. The sliding contact of the dimples 105 along the outer surface 146 of the corresponding sidewall portion of the fence 108 may cause the cover's portions 106 to flex, deform, move, pivot, or cam outwardly from their original or initial position. The cover's portions 106 may be generally resilient in nature that urges the cover's portions 106 to return to their original or initial positioning, which, in turn, creates a gripping or clamping force between the dimples 105 and the corresponding sidewall portions of the fence 108. As disclosed herein, the fence 108 does not include target locking holes for engagement with or for insertion of the dimples 105.

In this first latched position, the cover 104 is held down on or retained to the fence 108 by the interaction of (e.g., contact between, friction or interface fit between, etc.) the cover's dimples 105 and the corresponding fence sidewall portions and by the interaction of (e.g., contact between, friction or interface fit between, etc.) the cover's downwardly extending tabs 107 and the fence's outwardly extending tabs 109 and upwardly extending locking tabs or features 111 (FIG. 12). Each of the cover's downwardly extending tabs 107 is positioned and retained generally between a corresponding aligned or adjacent pair of the fence's outwardly extending tabs 109 and upwardly extending tabs 111.

In this first latched position, the cover 104 is still in a raised or upward position relative to the fence 108 such that the cover's inner surface 112 remains spaced apart from the top surface 142 (e.g., perimeter flange shown in FIG. 12, etc.) of the fence 108. Advantageously, this may allow or accommodate for the needed heat transfer to components under the shield 100 to insure the components are properly soldered to the printed circuit board (PCB).

The shape of the openings 115 in the fence 108 and the shape of cover's tabs 107 can also operate as alignment features when the cover 104 is being assembled onto the fence 108. For example, each of the cover's tabs 107 includes two downwardly protruding spaced-apart portions 117 (FIG. 4) that are shaped to fit within the respective openings 115 (FIGS. 4 and 12) along opposite sides of the corresponding tab 109 of the fence 108, to thereby help with aligning the cover 104 with the fence 108.

From the first latched position shown in FIG. 4, the cover 104 may be pushed downward again relative to the fence 108 into another or second (or final, fully down, operational) latched position shown in FIG. 5, e.g., shortly after the solder has solidified, etc. In this second latched position shown in FIG. 5, the cover 104 is held in place or retained by the interaction of (e.g., contact between, friction or interface fit between, etc.) the cover's downwardly extending longer tabs 107 and shorter tabs 113 and the fence's outwardly extending tabs 109 and upwardly extending tabs 111. Each of the cover's downwardly extending tabs 107, 113 is positioned and retained generally between a corresponding aligned or adjacent pair of the fence's outwardly extending tabs 109 and upwardly extending tabs 111.

The cover's tabs 107 and 113 are positioned along an inner surface 144 (FIG. 12) of the fence 108 that is opposite the outer surface 146 of the fence 108 along which the cover's dimples 105 are positioned. The downward movement of the cover 104 may also compress the thermal interface material 120 against one or more components under the shield 100. As disclosed herein, the fence 108 does not include target locking holes for engagement with or for insertion of the dimples 105. Instead, the dimples 105 are positioned along and in contact with sidewall portions of the fence 108 that are solid without any target locking holes for the dimples 105.

Figure 2:
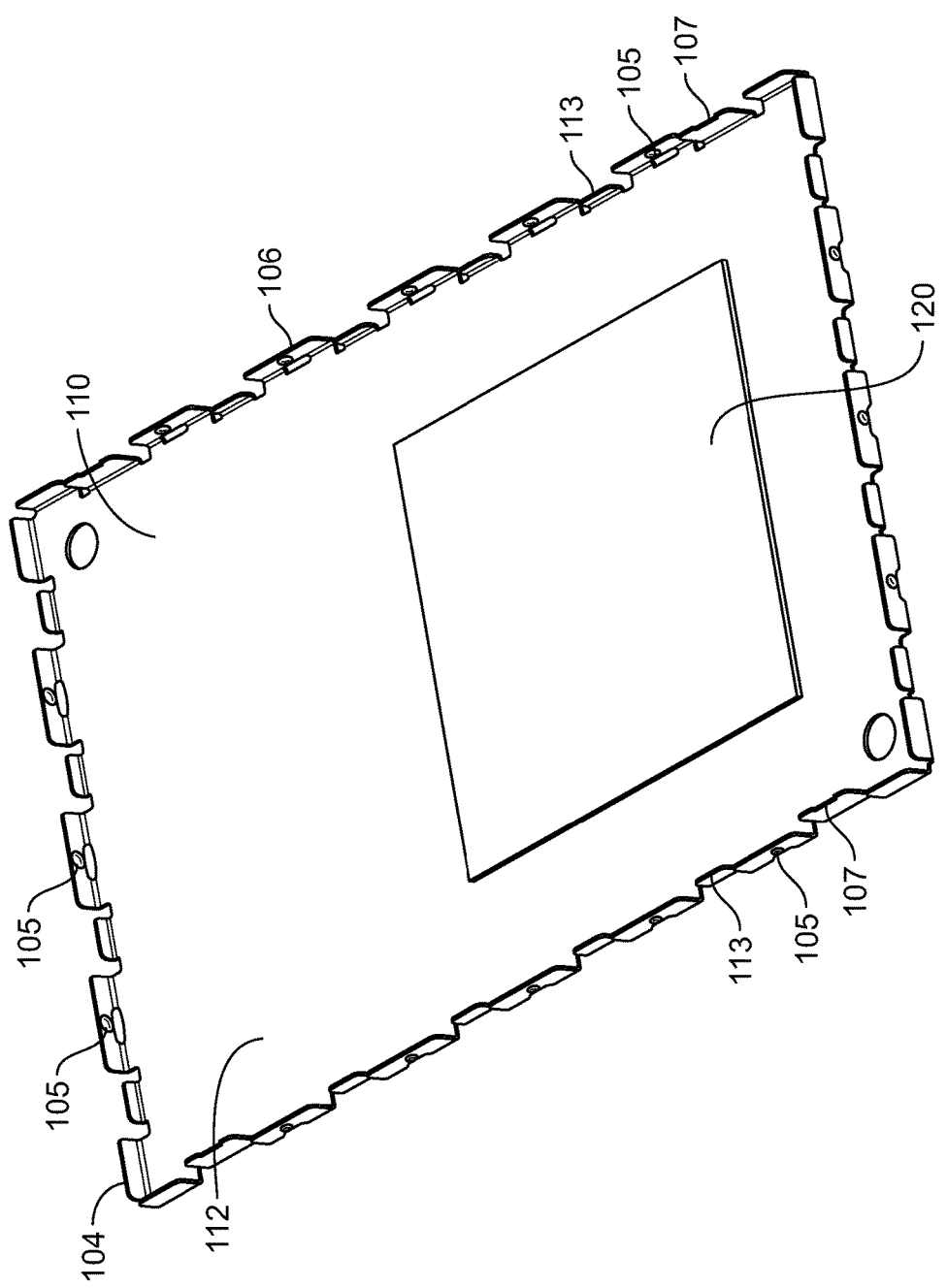
FIG. 2 is a perspective view showing a thermal interface material (TIM) along an inner surface of the cover shown in FIG. 1.

The cover's portions 106 that include the dimples 105 are spaced apart along a perimeter of the cover 104. The tabs 107, 113 are spaced apart from each other and spaced inwardly from the perimeter of the cover 104. The tabs 107, 113 along a side of the cover 104 are spaced inwardly relative to the cover's portions 106 that include the dimples 105 along that same side of the cover 104. The cover's portions 106 that include the dimples 105 may be alternatingly arranged with the tabs 107, 113. As shown in FIG. 2, each portion 106 of the cover 104 that includes a dimple 105 is either between two shorter tabs 113 or between a shorter tab 113 and a longer tab 107.

In the second position shown in FIG. 5, there is good compressive contact between the thermal interface material 120 (FIG. 2), the cover 104, and components on the PCB. There is also improved contact force reliability that provides a better performing BLS/thermal interface material assembly performance.

Because there is no target locking hole to engage, the cover 104 can also be pushed down to any height (e.g., continuously adjustable, etc.) onto the fence 104 between the initial unlatched position shown in FIG. 3 and the second (final, fully down, operational) latched position shown in FIG. 5. The cover 104 is positionable into a plurality of latched positions between the initial unlatched position (FIG. 3) and the second (or final) latched position (FIG. 5). In the second (or final) latched position (FIG. 5), the cover 104 has been fully pushed down onto the fence 108 such that the cover's inner surface 112 abuts against the fence's top surface 142 and prevents any farther downward movement of the cover 104 relative to the fence 108. The cover 104 may be attached to the fence 108 in at least two or more different latched positions in which the cover's inner surface 112 is spaced apart from the fence's top surface 142. Accordingly, this exemplary embodiment may thus provide an EMI shielding and thermal management assembly 100 having multi-position latching that allows the cover 104 to be attached to the fence 108 in multiple (at least three or more) different latched positions or heights.

The cover 104 includes an upper or top portion 110 having an inner surface 112 (FIG. 2) and an outer surface 116 (FIG. 1). The tabs 106, 107, and 113 downwardly depend from the upper or top portion 110 of the cover 104. As shown in FIG. 2, the thermal interface material 120 is along the cover's inner surface 112. Additionally, or alternatively, a thermal interface material may also be disposed atop one or more components of a printed circuit board such that the thermal interface material is compressed against the inner surface 112 of the top portion 110 of the cover 104, when the cover 104 is moved downward into the final, fully down, or operational latched position.

In an exemplary embodiment, the thermal interface material 120 may comprise a compliant or conformable thermal interface pad. The thermal interface 120 (with its compressive contact against an electrical component) can thus allow for improved heat transfer from the electrical component to the cover 104 as compared to those designs relying solely upon air to define the heat path between the electrical component and the underside of the cover. In alternative embodiments, other suitable thermal interface materials may be disposed along the inner surface 112 of the cover 104, including the example thermal interface materials disclosed herein.

The fence 108 is configured for installation to a substrate (e.g., printed circuit board (PCB), etc.) generally about one or more components on the substrate such that the one or more components are under the shield 100 and/or within an interior or shielding enclosure cooperatively defined by the cover 104 and fence 108. When the shield 100 is installed (e.g., soldered, etc.) on the substrate, the shield 100 is operable for shielding the one or more components that are within the interior or shielding enclosure cooperatively defined by the cover and fence 108. In this example, the fence 108 includes mounting feet 138 (FIG. 1) along the lower edge portions of the fence 108. The mounting feet 138 may be formed with castellations (e.g., formations with alternating notches and projections, etc.). The mounting feet 138 are configured to provide structure for connecting the fence 108 to a substrate, such as a PCB having components thereon. For example, the mounting feet 138 provide areas for soldering to the substrate. In such embodiments, the notches or openings between adjacent pairs of the mounting feet 138 allow solder to flow around the mounting feet 138 for securing the shield 100 to the substrate. FIG. 4 shows an exemplary solder pad pattern 140 along the bottom of the fence 108. In other embodiments, the mounting feet 138 may fit in corresponding openings in a substrate for securing the shield 100 to the substrate. In still further embodiments, a shield may not include any spaced-apart mounting feet along its lower edge portions. Instead, the shield may include sidewalls each having a generally continuous lower edge portion. In addition, alternative means besides soldering may also be employed for securing a shield to a substrate, such as adhesives, mechanical fasteners, etc.

FIG. 2 shows the shield 100 without any interior walls, dividers, or partitions such that the cover 104 and fence 108 generally define a single interior space or compartment. In other exemplary embodiments, a shield may include different EMI shielding compartments defined by interior walls and outer sidewalls. Components may be positioned in the different EMI shielding compartments such that the components are provided with EMI shielding by virtue of the EMI shielding compartments inhibiting the ingress and/or egress of EMI into and/or out of each EMI shielding compartment.

The shield 100 is shown having a generally rectangular shape. The tabs 106, 107, 113, of the cover 104 and the tabs 109 of the fence 108 are also shown to have a generally rectangular shape. Alternative embodiments may include shields and/or tabs having different configurations (e.g., circular, curved, triangular, irregular, other non-rectangular shapes, etc.). The external overall height of a shield may be less than about one millimeter (mm). The shapes and dimensions provided in this application are for purpose of illustration only as other exemplary embodiments may have a different configuration, such as a different size (e.g., larger or smaller) and/or a different shape (e.g., non-rectangular, etc.), etc.

FIG. 13 is a line graph of force in Newtons versus position in millimeters showing the amount of force to push out the cover 104 (one locking feature completely released) according to this exemplary embodiment. Accordingly, the cover 104 may thus be removable from and reattachable to the fence 108 in exemplary embodiments. The results shown in FIG. 13 are provided only for purposes of illustration and not for purposes of limitation as other exemplary embodiments may be configured differently and/or have different performance.

In exemplary embodiments, a board level shield suitable is suitable for use in providing electromagnetic interference (EMI) shielding for one or more components on a substrate. The board level shield generally includes a board level shield generally includes a cover (or lid) and a fence (or frame or base). The cover is attachable to the fence in a plurality of different latched positions in which an inner surface of the top portion of the cover is spaced apart from a top surface of the fence by a different distance for each of the different latched positions.

The cover may be attachable to the fence in a final or fully down latched position in which the inner surface of the top portion of the cover abuts against the top surface of the fence. A thermal interface material may be along the inner surface of the top portion of the cover. When the cover is attached to the fence in one of the different latched positions in which the inner surface of the top portion of the cover is spaced apart from the top surface of the fence, a spaced distance may separate the thermal interface material from one or more components on a substrate. But when the cover is attached to the fence in the final or fully down latched position in which the inner surface of the top portion of the cover abuts against the top surface of the fence, the spaced distance may be eliminated and the thermal interface material may contact and/or may be compressed against the one or more components on the substrate.

The different latched positions may include at least a first latched position in which the cover is retained to the fence such that the inner surface of the top portion of the cover is spaced apart from the top surface of the fence by a first distance, and a second latched position in which the cover is retained to the fence such that the inner surface of the top portion of the cover is spaced apart from the top surface of the fence by a second distance less than the first distance. The cover may also be attachable to the fence in a third latched position in which the inner surface of the top portion of the cover abuts against the top surface of the fence.

The cover may include a plurality of dimples that slide along in contact with sidewall portions of the fence when the cover is moved downward onto the fence between the different latched positions. The sidewall portions of the fence do not include any holes for engagement with or insertion of the dimples. The cover may include a plurality of resilient tabs that include the dimples and that depend downwardly from the top portion of the cover. The dimples may be configured to operate as camming surfaces such that the sliding contact of the dimples along the sidewall portions of the fence urges the resilient tabs outward away from the fence and the resiliency of the resilient tabs urges the resilient tabs to return to an original or initial position. The cover may be positionable on the fence in an initial unlatched position in which the dimples contact an upper portion of the fence to thereby hold the cover up relative to the fence in the initial unlatched position.

The cover may include a plurality of tabs depending downwardly from the top portion of the cover. The fence may include a plurality of upwardly extending tabs and a plurality of outwardly extending tabs. Each tab of the cover may be positioned and retained generally between a corresponding pair of the upwardly extending tabs and outwardly extending tabs of the fence when the cover is attached to the fence in one of the different latched positions. The cover may be positionable on the fence in an initial unlatched position in which the tabs of the cover contact an upper surface of the outwardly extending tabs of the fence to thereby hold the cover up relative to the fence in the initial unlatched position.

The cover may include a plurality of shorter tabs depending downwardly from the top portion of the cover. The shorter tabs of the cover may be positioned above the outwardly extending tabs of the fence when the cover is attached to the fence in one of the different latched positions. Each shorter tab of the cover may be positioned and retained generally between a corresponding pair of the upwardly extending tabs and outwardly extending tabs of the fence when the cover is attached to the fence in a final or fully down latched position in which the inner surface of the top portion of the cover abuts against the top surface of the fence. The upwardly extending tabs of the fence may be sized so as to not extend above or beyond a top surface of the fence. The tabs of the cover may include downwardly protruding spaced-apart portions shaped to fit within corresponding openings along opposite sides of the outwardly extending tabs of the fence, whereby positioning of the downwardly protruding spaced-apart portions within the corresponding openings helps align the cover with the fence.

In an exemplary embodiment, a board level shield generally includes a cover (or lid) and a fence (or frame or base). The cover includes a top portion, a first plurality of tabs depending downwardly from the top portion of the cover and including a plurality of dimples, and second plurality of tabs depending downwardly from the top portion of the cover. The fence includes sidewall portions without any holes for engagement with or insertion of the dimples of the cover. The fence also includes a plurality of upwardly extending tabs and a plurality of outwardly extending tabs. The cover is attachable to the fence in a plurality of different latched positions in which each of the second plurality of tabs of the cover is positioned and retained generally between a corresponding pair of the upwardly extending tabs and outwardly extending tabs of the fence. The dimples may slide along in contact with the sidewall portions of the fence when the cover is moved downward onto the fence between the different latched positions.

A thermal interface material may be along an inner surface of the top portion of the cover. The different latched positions may include at least a first latched position in which the cover is retained to the fence and a spaced distance separates the thermal interface material from the one or more components on the substrate, and a second latched position in which the cover is retained to the fence and the spaced distance is eliminated such that the thermal interface material contacts and/or is compressed against the one or more components on the substrate.

The dimples may be configured to operate as camming surfaces such that the sliding contact of the dimples along the sidewall portions of the fence urges the resilient tabs outward away from the fence and the resiliency of the resilient tabs urges the resilient tabs to return to an original or initial position. The cover may be positionable on the fence in an initial unlatched position in which the dimples and/or the second plurality of tabs contact an upper portion of the fence to thereby hold the cover up relative to the fence in the initial unlatched position.

The cover may include the cover includes a third plurality of tabs depending downwardly from the top portion of the cover and that are shorter than the first and second pluralities of tabs. The third plurality of tabs may be positioned above the outwardly extending tabs of the fence when the cover is attached to the fence in one of the different latched positions. Each of the third plurality of tabs may be positioned and retained generally between a corresponding pair of the upwardly extending tabs and outwardly extending tabs of the fence when the cover is attached to the fence in a final or fully down latched position in which an inner surface of the top portion of the cover abuts against a top surface of the fence.

The upwardly extending tabs of the fence may be sized so that they do not extend above or beyond a top surface of the fence. Each of the second plurality of tabs of the cover may include downwardly protruding spaced-apart portions shaped to fit within corresponding openings along opposite sides of the outwardly extending tabs of the fence, whereby positioning of the downwardly protruding spaced-apart portions within the corresponding openings helps align the cover with the fence.

An electronic device may include a printed circuit board including one or more components thereon and a board level shield as disclosed herein. The board level shield may be positioned relative to the printed circuit board such that the one or more components along the printed circuit board are within an interior cooperatively defined by the cover and the fence.

Also disclosed are methods relating to board level shields. For example, an exemplary embodiment of a method generally includes positioning a cover of a board level shield on a fence of the board level shield in an initial, unlatched position, pushing the cover downward onto the fence into a first latched position in which an inner surface of a top portion of the cover is spaced apart from a top surface of the fence by a first distance, and pushing the cover farther downward onto the fence from the first latched position into a second latched position in which the inner surface of the top portion of the cover is spaced apart from the top surface of the fence by a second distance less than the first distance.

The step, process, or operation of pushing the cover farther downward onto the fence from the first latched position into a second latched position may include pushing the cover fully down onto the fence such that the inner surface of the top portion of the cover abuts against the top surface of the fence.

The method may include positioning the board level shield relative to a printed circuit board such that one or more components along the printed circuit board are within an interior cooperatively defined by the cover and the fence, whereby the board level shield is operable for providing board level shielding for the one or more components within the interior cooperatively defined by the cover and the fence The method may include soldering the board level shield to the substrate when the cover is attached to the fence in the first latched position, and then pushing the cover farther downward onto the fence from the first latched position into a second latched position after soldering.

A thermal interface material may be along the inner surface of the top portion of the cover. A spaced distance may separate the thermal interface material from the one or more components on the substrate in the first latched position. The step, process, or operation of pushing the cover farther downward onto the fence from the first latched position into a second latched position may include compressing the thermal interface material against the one or more components on the substrate.

The shields (e.g., 100, etc.) disclosed herein may be formed from a wide range of materials, which are preferably electrically-conductive materials. For example, the covers (e.g., 104, etc.) and fence (e.g., 108, etc.) may be formed from metals or metal alloys, such as cold rolled steel (e.g., tin-plated cold rolled steel, etc.), sheet metal, stainless steel, copper alloys (e.g., tin-plated copper alloys, etc.), nickel-silver alloys (e.g., nickel-silver alloy 770, etc.), copper-nickel alloys, carbon steel, brass, copper, aluminum, copper-beryllium alloys, phosphor bronze, steel, alloys thereof, among other suitable electrically-conductive materials. The fence and/or cover may also be formed from a plastic material coated with electrically-conductive material. The materials provided herein are for purposes of illustration only, as the shield may be made from different materials depending, for example, on the particular application, such as the electrical components to be shielded, space considerations within the overall electronic device, EMI shielding and heat dissipation needs, and other factors.

In some exemplary embodiments, the BLS cover or upper surface may include a generally flat, planar and/or central pick-up surface configured for use in handling the EMI shield with pick-and-place equipment (e.g., vacuum pick-and-place equipment, etc.). The pick-up surface may be configured for use as a pick-up area that may be gripped or to which suction may be applied by the pick-and-place equipment for handling during, for example, fabrication of the shield and/or installation of the shield to a PCB. The central location of the pick-up surface may allow for balanced manipulation of the shield during handling. In other exemplary embodiments, the BLS may, for example, have tabs at the corners and/or along the side edges for use as pick-up surfaces in addition to or in place of centrally located pick-up surfaces.

In exemplary embodiments, at least a portion of the board level shield may be thermally conductive to help establish or define at least a portion of a thermally-conductive heat path from a heat source (e.g., board-mounted heat generating electronic component of an electronic device, etc.) to a heat dissipating and/or heat removal structure, such as a heat sink, an exterior case or housing of an electronic device (e.g., cellular phone, smart phone, tablet, laptop, personal computer, etc.), heat spreader, heat pipe, etc. For example, the fence and/or cover may be electrically conductive and thermally conductive. In this example, one or more thermal interface materials (e.g., compliant or conformable thermal interface pad, putty, or gap filler, etc.) may be disposed along (e.g., adhesively attached via a PSA tape, etc.) an outer surface and/or inner surface of the cover. A thermal interface material along an outer surface of the cover may be configured to make contact (e.g., direct physical contact, etc.) with a heat dissipating device or heat removal structure. By way of further example, the thermal interface material may comprise a conformable and/or flowable thermal interface material having sufficient compressibility, flexibility, deformability, and/or flowability to allow the thermal interface material to relatively closely conform to the size and outer shape of the heat dissipating device or heat removal structure, thereby removing air gaps therebetween. The thermal interface may also be a form-in-place material that may be dispensed in place onto the shielding apparatus.

In embodiments that include one or more thermal interface materials (e.g., TIM1, TIM2, etc.), a wide variety of materials may be used for any of the one or more TIMs in those embodiments. For example, the one or more TIMs may be formed from materials that are better thermal conductors and have higher thermal conductivities than air alone. The one or more TIMs may comprise thermal interface materials from Laird Technologies, such as any of the Tflex™ series gap fillers, Tpcm™ series thermal phase change materials, Tgrease™ series thermal greases, Tpli™ series gap fillers, Tgon™ series thermal interface materials, and/or IceKap™ series thermal interface materials. By way of further example, a TIM may be molded from thermally and electrically conductive elastomer. The TIMs may comprise thermally conductive compliant materials or thermally conductive interface materials formed from ceramic particles, metal particles, ferrite EMI/RFI absorbing particles, metal or fiberglass meshes in a base of rubber, gel, grease or wax, etc.

A TIM may comprise a thermally-conductive compliant material or thermally conductive interface material formed from ceramic particles, metal particles, ferrite EMI/RFI absorbing particles, metal or fiberglass meshes in a base of rubber, gel, grease or wax, etc. Exemplary embodiments may include a TIM with a thermal conductivity higher than 6 W/mK, less than 1.2 W/mK, or other values between 1.2 and 6 W/mk. For example, a TIM may be used that has a thermal conductivity higher than air's thermal conductivity of 0.024 W/mK, such as a thermal conductivity of about 0.3 W/mk, of about 3.0 W/mK, or somewhere between 0.3 W/mk and 3.0 W/mk, etc.

A TIM may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermal putties, thermal greases, thermally-conductive additives, etc. A TIM may be configured to have sufficient conformability, compliability, and/or softness to allow the TIM material to closely conform to a mating surface when placed in contact with the mating surface, including a non-flat, curved, or uneven mating surface. A TIM may comprise an electrically conductive soft thermal interface material formed from elastomer and at least one thermally-conductive metal, boron nitride, and/or ceramic filler, such that the soft thermal interface material is conformable even without undergoing a phase change or reflow. The TIM may be a non-metal, non-phase change material that does not include metal and that is conformable even without undergoing a phase change or reflow. A TIM may comprise a thermal interface phase change material.

A TIM may comprise one or more conformable thermal interface material gap filler pads having sufficient deformability, compliance, conformability, compressibility, flowability, and/or flexibility for allowing a pad to relatively closely conform (e.g., in a relatively close fitting and encapsulating manner, etc.) to the size and outer shape of another component. Also, the thermal interface material gap filler pad may be a non-phase change material and/or be configured to adjust for tolerance or gap by deflecting.

In some exemplary embodiments, the thermal interface material may comprise a non-phase change gap filler, gap pad, or putty that is conformable without having to melt or undergo a phase change. The thermal interface material may be able to adjust for tolerance or gaps by deflecting at low temperatures (e.g., room temperature of 20° C. to 25° C., etc.). The thermal interface material may have a Young's modulus and Hardness Shore value considerably lower than copper or aluminum. The thermal interface material may also have a greater percent deflection versus pressure than copper or aluminum.

In some exemplary embodiments, one or more EMI or microwave absorbers may be disposed along an outer surface and/or inner surface of the cover. In embodiments that include one or more EMI or microwave absorbers, a wide range of materials may be used, such as carbonyl iron, iron silicide, iron particles, iron-chrome compounds, metallic silver, carbonyl iron powder, SENDUST (an alloy containing 85% iron, 9.5% silicon and 5.5% aluminum), permalloy (an alloy containing about 20% iron and 80% nickel), ferrites, magnetic alloys, magnetic powders, magnetic flakes, magnetic particles, nickel-based alloys and powders, chrome alloys, and any combinations thereof. The EMI absorbers may comprise one or more of granules, spheroids, microspheres, ellipsoids, irregular spheroids, strands, flakes, powder, and/or a combination of any or all of these shapes.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A board level shield suitable for use in providing electromagnetic interference (EMI) shielding for one or more components on a substrate, the board level shield comprising:
   a fence including a plurality of upwardly extending tabs, a plurality of outwardly extending tabs, and a top surface; and
   a cover including a top portion having an inner surface, and a plurality of tabs extending downwardly from the top portion of the cover;
   wherein the cover is attachable to the fence in more than two different latched positions in which the cover is retained to the fence, and the inner surface of the top portion of the cover is spaced apart from the top surface of the fence by a different distance for each of the more than two different latched positions; and
   wherein each of said tabs of the cover is positioned and retained between a corresponding pair of the upwardly extending tabs and outwardly extending tabs of the fence when the cover is attached to the fence in one of the more than two different latched positions.

2. The board level shield of claim 1, wherein the cover is positionable on the fence in an initial unlatched position in which the tabs of the cover contact an upper surface of the outwardly extending tabs of the fence to thereby hold the cover up relative to the fence in the initial unlatched position.

3. The board level shield of claim 1, wherein:
   the cover includes a plurality of shorter tabs extending downwardly from the top portion of the cover;
   the shorter tabs of the cover are positioned above the outwardly extending tabs of the fence when the cover is attached to the fence in one of the more than two different latched positions; and
   each of said shorter tabs of the cover is positioned and retained between a corresponding pair of the upwardly extending tabs and outwardly extending tabs of the fence when the cover is attached to the fence in a final or fully down latched position in which the inner surface of the top portion of the cover abuts against the top surface of the fence.

4. The board level shield of claim 1, wherein:
   the upwardly extending tabs of the fence do not extend above or beyond the top surface of the fence; and/or
   the tabs of the cover include downwardly protruding spaced-apart portions shaped to fit within corresponding openings along opposite sides of the outwardly extending tabs of the fence, whereby positioning of the downwardly protruding spaced-apart portions within the corresponding openings helps align the cover with the fence.

5. The board level shield of claim 1, wherein:
the cover includes a plurality of dimples that slide along in contact with sidewall portions of the fence when the cover is moved downward onto the fence between the more than two different latched positions; and
the sidewall portions of the fence do not include any holes for engagement with or insertion of the dimples.

6. The board level shield of claim 5, wherein:
the cover includes a plurality of resilient tabs that include the dimples and that extend downwardly from the top portion of the cover; and
the dimples are configured to operate as camming surfaces such that sliding contact of the dimples along the sidewall portions of the fence urges the resilient tabs outward away from the fence and resiliency of the resilient tabs urges the resilient tabs to return to an original or initial position.

7. The board level shield of claim 5, wherein the cover is positionable on the fence in an initial unlatched position in which the dimples contact an upper portion of the fence to thereby hold the cover up relative to the fence in the initial unlatched position.

8. The board level shield of claim 1, wherein the cover is attachable to the fence in a final or fully down latched position in which the inner surface of the top portion of the cover abuts against the top surface of the fence.

9. The board level shield of claim 8, wherein a thermal interface material is along the inner surface of the top portion of the cover such that:
a spaced distance separates the thermal interface material from the one or more components on the substrate when the cover is attached to the fence in one of the more than two different latched positions in which the inner surface of the top portion of the cover is spaced apart from the top surface of the fence; and
the spaced distance is eliminated and the thermal interface material contacts and/or is compressed against the one or more components on the substrate when the cover is attached to the fence in the final or fully down latched position in which the inner surface of the top portion of the cover abuts against the top surface of the fence.

10. The board level shield of claim 8, wherein:
the cover includes a plurality of dimples that slide along in contact with sidewall portions of the fence when the cover is moved downward onto the fence between the more than two different latched positions; and
the sidewall portions of the fence do not include any holes for engagement with or insertion of the dimples.

11. The board level shield of claim 1, wherein the more than two different latched positions include at least:
a first latched position in which the cover is retained to the fence such that the inner surface of the top portion of the cover is spaced apart from the top surface of the fence by a first distance;
a second latched position in which the cover is retained to the fence such that the inner surface of the top portion of the cover is spaced apart from the top surface of the fence by a second distance less than the first distance; and
a third latched position in which the inner surface of the top portion of the cover abuts against the top surface of the fence.

12. The board level shield of claim 1, wherein:
a thermal interface material is along the inner surface of the top portion of the cover;
the more than two different latched positions include at least:
a first latched position in which a spaced distance separates the thermal interface material from the one or more components on the substrate when the cover is attached to the fence in the first latched position; and
at least one other latched position in which the spaced distance is eliminated and the thermal interface material contacts and/or is compressed against the one or more components on the substrate when the cover is attached to the fence in the at least one other latched position.

13. A board level shield suitable for use in providing electromagnetic interference (EMI) shielding for one or more components on a substrate, the board level shield comprising:
a cover including a top portion, a first plurality of tabs extending downwardly from the top portion of the cover and including a plurality of dimples, and second plurality of tabs extending downwardly from the top portion of the cover;
a fence including sidewall portions without any holes for engagement with or insertion of the dimples of the cover, a plurality of upwardly extending tabs, and a plurality of outwardly extending tabs;
wherein the cover is attachable to the fence in a plurality of different positions in which each of the second plurality of tabs of the cover is positioned and retained between a corresponding pair of the upwardly extending tabs and outwardly extending tabs of the fence; and
whereby the dimples slide along in contact with the sidewall portions of the fence when the cover is moved downward onto the fence between the different positions.

14. The board level shield of claim 13, wherein:
a thermal interface material is along an inner surface of the top portion of the cover; and
the different positions include at least:
a first position in which the cover is retained to the fence and a spaced distance separates the thermal interface material from the one or more components on the substrate; and
a second position in which the cover is retained to the fence and the spaced distance is eliminated such that the thermal interface material contacts and/or is compressed against the one or more components on the substrate.

15. The board level shield of claim 13, wherein:
the dimples are configured to operate as camming surfaces such that sliding contact of the dimples along the sidewall portions of the fence urges the resilient tabs outward away from the fence and resiliency of the resilient tabs urges the resilient tabs to return to an original or initial position of the resilient tabs; and/or
the cover is positionable on the fence in an initial position of the cover in which the dimples and/or the second plurality of tabs contact an upper portion of the fence to thereby hold the cover up relative to the fence in the initial position of the cover.

16. The board level shield of claim 13, wherein:
the cover includes a third plurality of tabs extending downwardly from the top portion of the cover and that are shorter than either of the first and second pluralities of tabs;
the third plurality of tabs are positioned above the outwardly extending tabs of the fence when the cover is attached to the fence in one of the different positions; and each of the third plurality of tabs is positioned and retained between a corresponding pair of the upwardly extending tabs and outwardly extending tabs of the fence when the cover is attached to the fence in a final or fully down position in which an inner surface of the top portion of the cover abuts against a top surface of the fence.

17. The board level shield of claim 13, wherein:
the upwardly extending tabs of the fence do not extend above or beyond a top surface of the fence; and/or
each of the second plurality of tabs of the cover includes downwardly protruding spaced-apart portions shaped to fit within corresponding openings along opposite sides of the outwardly extending tabs of the fence, whereby positioning of the downwardly protruding spaced-apart portions within the corresponding openings helps align the cover with the fence.

18. A board level shield suitable for use in providing electromagnetic interference (EMI) shielding for one or more components on a substrate, the board level shield comprising:

a cover including a top portion and a plurality of tabs extending downwardly from the top portion of the cover;
a fence including a plurality of upwardly extending tabs and a plurality of outwardly extending tabs;
wherein the cover is attachable to the fence in a plurality of different positions in which each of the plurality of tabs of the cover is positioned and retained between a corresponding pair of the upwardly extending tabs and outwardly extending tabs of the fence, whereby the cover is retained to the fence, and an inner surface of the top portion of the cover is spaced apart from a top surface of the fence by a different distance for each of the different positions.

19. The board level shield of claim 18, wherein the cover includes a second plurality of tabs including a plurality of dimples, and the fence includes sidewall portions without any holes for engagement with or insertion of the dimples of the cover, whereby the dimples slide along in contact with the sidewall portions of the fence when the cover is moved downward onto the fence between the different positions.

* * * * *